US010366968B2

(12) United States Patent
Reingruber et al.

(10) Patent No.: US 10,366,968 B2
(45) Date of Patent: Jul. 30, 2019

(54) INTERCONNECT STRUCTURE FOR A MICROELECTRONIC DEVICE

(71) Applicant: Intel IP Corporation, Santa Clara, CA (US)

(72) Inventors: Klaus Reingruber, Langquaid (DE); Andreas Wolter, Regensburg (DE); Georg Seidemann, Landshut (DE); Thomas Wagner, Regelsbach (DE); Bernd Waidhas, Pettendorf (DE)

(73) Assignee: Intel IP Corporation, Santa Clara, CA (US)

( * ) Notice: Subject to any disclaimer, the term of this patent is extended or adjusted under 35 U.S.C. 154(b) by 40 days.

(21) Appl. No.: 15/282,855

(22) Filed: Sep. 30, 2016

(65) Prior Publication Data

US 2018/0096970 A1    Apr. 5, 2018

(51) Int. Cl.
*H01L 25/065* (2006.01)
*H01L 23/00* (2006.01)
*H01L 23/31* (2006.01)

(52) U.S. Cl.
CPC ...... *H01L 25/0657* (2013.01); *H01L 23/3128* (2013.01); *H01L 24/06* (2013.01); *H01L 24/14* (2013.01); *H01L 24/17* (2013.01); *H01L 24/13* (2013.01); *H01L 2224/0237* (2013.01); *H01L 2224/02311* (2013.01); *H01L 2224/02379* (2013.01); *H01L 2224/04105* (2013.01); *H01L 2224/06132* (2013.01); *H01L 2224/06134* (2013.01); *H01L 2224/09177* (2013.01);
(Continued)

(58) Field of Classification Search
CPC . H01L 25/0657; H01L 23/3128; H01L 24/17; H01L 24/14; H01L 24/06; H01L 24/13
See application file for complete search history.

(56) References Cited

U.S. PATENT DOCUMENTS 5,886,409 A *   3/1999  Ishino ................. H01L 23/3107
                                                257/693
7,402,901 B2 *  7/2008  Hatano ............... H01L 23/5389
                                                257/684
(Continued)

FOREIGN PATENT DOCUMENTS

WO   WO-2016099523 A1   6/2016
WO   WO-2017108121 A1   6/2017

OTHER PUBLICATIONS

"International Application Serial No. PCT/US2017/046027, International Search Report dated Nov. 15, 2017", 3 pgs.
(Continued)

*Primary Examiner* — Jarrett J Stark
(74) *Attorney, Agent, or Firm* — Schwegman Lundberg & Woessner, P.A.

(57) ABSTRACT

A microelectronic package with two semiconductor die coupled on opposite sides of a redistribution layer 108, and at least partially overlapping with one another. At least a first of the semiconductor die includes two sets of contacts, the first group of contacts arranged at a lesser pitch relative to one another than are a second group of contacts. The first group of contacts at the larger pitch are placed to engage contacts in a redistribution layer 108. The second group of contacts at the lesser pitch are placed to engage respective contacts at the same pitch on the second semiconductor die.

13 Claims, 6 Drawing Sheets

(52) U.S. Cl.
CPC ............... *H01L 2224/11334* (2013.01); *H01L 2224/12105* (2013.01); *H01L 2224/13024* (2013.01); *H01L 2224/1403* (2013.01); *H01L 2224/14051* (2013.01); *H01L 2224/16145* (2013.01); *H01L 2224/1703* (2013.01); *H01L 2224/17051* (2013.01); *H01L 2224/73204* (2013.01); *H01L 2225/0652* (2013.01); *H01L 2225/06513* (2013.01); *H01L 2225/06517* (2013.01); *H01L 2225/06524* (2013.01); *H01L 2225/06527* (2013.01); *H01L 2225/06562* (2013.01)

(56) References Cited

U.S. PATENT DOCUMENTS

| | | | | |
|---|---|---|---|---|
| RE44,438 E | * | 8/2013 | Pendse | H01L 23/3128 |
| | | | | 257/E23.106 |
| 9,318,474 B2 | * | 4/2016 | Zhai | H01L 25/165 |
| 9,633,974 B2 | * | 4/2017 | Zhai | H01L 25/0652 |
| 9,653,428 B1 | * | 5/2017 | Hiner | H01L 25/0655 |
| 9,666,559 B2 | * | 5/2017 | Wang | H01L 25/0655 |
| 2003/0094687 A1 | * | 5/2003 | Daves | H01L 23/49833 |
| | | | | 257/700 |
| 2003/0201521 A1 | * | 10/2003 | Tsai | H01L 23/49816 |
| | | | | 257/678 |
| 2006/0108697 A1 | * | 5/2006 | Wang | H01L 25/0652 |
| | | | | 257/777 |
| 2007/0045862 A1 | * | 3/2007 | Corisis | H01L 21/561 |
| | | | | 257/777 |
| 2008/0157316 A1 | * | 7/2008 | Yang | H01L 24/24 |
| | | | | 257/685 |
| 2011/0031634 A1 | | 2/2011 | Pagaila | |
| 2011/0074028 A1 | * | 3/2011 | Pendse | H01L 21/563 |
| | | | | 257/737 |
| 2011/0210444 A1 | | 9/2011 | Jeng et al. | |
| 2011/0285005 A1 | | 11/2011 | Lin et al. | |
| 2012/0074562 A1 | * | 3/2012 | Yu | H01L 23/147 |
| | | | | 257/737 |
| 2012/0098123 A1 | * | 4/2012 | Yu | H01L 21/563 |
| | | | | 257/737 |
| 2012/0267779 A1 | * | 10/2012 | Lin | H01L 24/11 |
| | | | | 257/737 |
| 2012/0273782 A1 | * | 11/2012 | Goel | H01L 22/32 |
| | | | | 257/48 |
| 2012/0319291 A1 | * | 12/2012 | Chiou | H01L 21/76898 |
| | | | | 257/774 |
| 2013/0063843 A1 | * | 3/2013 | Chen | H01L 23/552 |
| | | | | 361/56 |
| 2013/0161812 A1 | | 6/2013 | Kim et al. | |
| 2013/0168854 A1 | * | 7/2013 | Karikalan | H01L 24/49 |
| | | | | 257/738 |
| 2013/0175686 A1 | * | 7/2013 | Meyer | H01L 25/0655 |
| | | | | 257/738 |
| 2013/0292831 A1 | | 11/2013 | Liu et al. | |
| 2014/0185264 A1 | * | 7/2014 | Chen | H01L 23/3128 |
| | | | | 361/814 |
| 2014/0217604 A1 | | 8/2014 | Chou et al. | |
| 2015/0061130 A1 | | 3/2015 | Meyer | |
| 2015/0171063 A1 | * | 6/2015 | Zhai | H01L 25/165 |
| | | | | 257/713 |
| 2015/0287672 A1 | * | 10/2015 | Yazdani | H01L 21/486 |
| | | | | 257/414 |
| 2016/0056087 A1 | * | 2/2016 | Wu | H01L 23/49833 |
| | | | | 257/738 |
| 2016/0093597 A1 | * | 3/2016 | Chang | H01L 24/32 |
| | | | | 257/737 |
| 2016/0260684 A1 | * | 9/2016 | Zhai | H01L 25/0652 |
| 2016/0268234 A1 | | 9/2016 | Lin et al. | |
| 2016/0284635 A1 | * | 9/2016 | Ganesan | H01L 24/17 |
| 2016/0329272 A1 | * | 11/2016 | Geissler | H01L 24/13 |
| 2016/0358891 A1 | | 12/2016 | Geissler et al. | |
| 2017/0062383 A1 | * | 3/2017 | Yee | H01L 25/0652 |
| 2017/0125379 A1 | * | 5/2017 | Chen | H01L 25/0655 |
| 2017/0170111 A1 | * | 6/2017 | Reingruber | H01L 23/528 |

OTHER PUBLICATIONS

"International Application Serial No. PCT/US2017/046027, Written Opinion dated Nov. 15, 2017", 5 pgs.

\* cited by examiner

INTERCONNECT STRUCTURE FOR A MICROELECTRONIC DEVICE

TECHNICAL FIELD

Embodiments described herein generally relate to methods and apparatus for providing interconnections in microelectronic devices; and more particularly relate to methods and apparatus for interconnecting at least two semiconductor die to one another through use of contacts placed at a closer spacing to one another than contacts used for other interconnections of at least one of the semiconductor die.

BACKGROUND

Many forms of microelectronic devices such as IC (integrated circuit) packages include one or more semiconductor die coupled to a redistribution structure adapted to facilitate interconnections with other devices (for example a printed circuit board (PCB), such as a motherboard, or another modular assembly). For example, such a redistribution structure (termed herein a "redistribution layer") may connect to the contacts on a semiconductor die, and provide electrical traces to redistribute the electrical paths from the die contacts to other locations. In the case of "fan-out" packages, the redistribution layer will include electrical traces arranged to redistribute at least a substantial portion, or all, of the contacts on the die to contact locations outside the lateral dimensions of the semiconductor die itself (the "footprint" of the die). In many cases, the lateral spacing between contacts, known as the "pitch" of the contacts, required to interface with such a redistribution layer is much larger than can be achieved through semiconductor manufacturing technology for the die itself. It would be desirable to minimize the required pitch of some group of contacts of a semiconductor die, and to facilitate direct connection through such contacts to another semiconductor die, rather than to a redistribution layer.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

As noted above, many manufacturing processes require a semiconductor die be manufactured with a contact pitch suitable for engagement with a redistribution layer, in which the contact pitch is larger than a contact pitch that would be technically feasible to produce on the semiconductor die. This can result in the size of a semiconductor die being dictated in part by the area needed to provide the necessary external contacts at a pitch suitable for engagement with a redistribution layer. As used herein, the term "redistribution layer" is used consistent with its conventional terminology in the industry, to refer collectively to the multiple material levels (for example, two layers of dielectric on opposite sides of a metal or other conductive material layer) which collectively form contacts and conductive traces redistributing the contacts of the semiconductor die to (commonly) laterally offset locations. The term contemplates redistribution structures having either a single level of metal or another conductor, or multiple levels of metal or other conductors, vertically offset from one another, and in many cases selectively communicating with one another through interconnects in the redistribution layer.

In some cases, however, not all contacts of a semiconductor die require such redistribution through a redistribution layer, and thus do not require the contact pitch as may be dictated by the requirements of engaging a redistribution layer. An example of such a microelectronic device is one in which a first semiconductor die will communicate directly with a second semiconductor die. Many examples of such microelectronic devices can be envisioned, but as one example, a semiconductor die such as that for a processor can communicate directly with other die such as, for example, memory, a graphics processor, a wireless interface device, and any one or more of many other types of die. As identified herein, a package that facilitates direct communication between first and second die can also be configured to facilitate that the direct communication between the two die is through a respective group of contacts on each die that are at a finer pitch than contacts (of either die) which engage a redistribution layer.

Figure 1A:
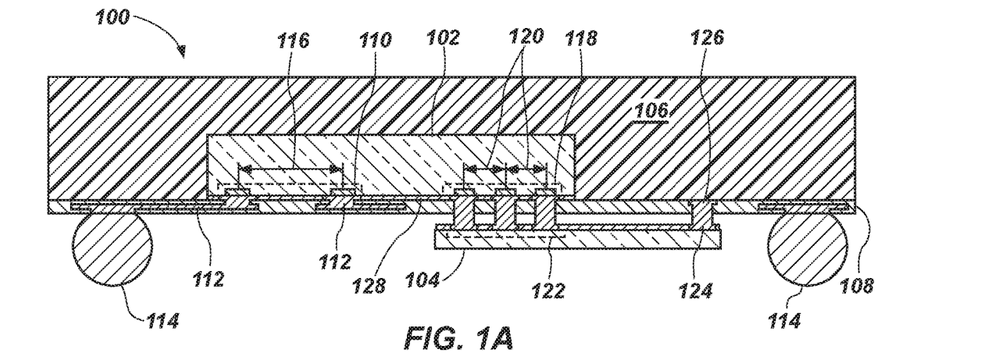
FIGS. 1A-B depict, in FIG. 1A, a cross section of an example IC package incorporating the techniques described herein; and in FIG. 1B the example IC package of FIG. 1A including additional optional structures.

Referring now to FIG. 1A, that figure depicts a vertical cross-section of an example IC package, indicated generally at 100, incorporating the techniques described herein. Package 100 includes a first semiconductor die 102 and a second semiconductor die 104 coupled directly to the first semiconductor die 102 (as will be described in more detail below). In the example package 100, first semiconductor die 102 is encased within a molded structure 106, which, along with first semiconductor die 102 supports a redistribution layer 108, with first semiconductor die 102 located on a first side of redistribution layer 108. As can be seen in the figure, second semiconductor die 104 is on the opposite side of redistribution layer 108, in what is sometimes referred to in the art as a "hanging die" configuration. Though in the depicted example package 100 only a single hanging die is depicted, multiple hanging die may be coupled to the first semiconductor die in the same manner described herein for second semiconductor die 104. Package 100 is illustrative only, and may have any desired structure, in accordance with the description provided herein. For example, many packages will extend laterally to a significantly greater dimension, and providing multiple rows of contact balls 114 extending around the package.

In the depicted example package 100, redistribution layer 108 is in the form of a "fan-out" layer, in which a first group of contacts, indicated generally at 110 (see bracketed region), on first semiconductor die 102 are redistributed through conductive traces 112 in redistribution layer 108, to locations beyond the lateral dimensions of first semiconductor die 102, as indicated by contact balls 114 (also known by the term "solder balls," without implying a particular material for the balls). In the depicted example, the contact balls 114 are on the same side of redistribution layer 108 as second semiconductor die 104.

As can be seen from the depicted pair of contacts within first group 110, the adjacent contacts are separated by a specified distance, or "pitch," as indicated at 116. As noted earlier herein, the pitch 116 for this first group of contacts 110 that will be coupled to redistribution layer 108 is typically determined at least partially in response to the minimum line width and contact spacing for the redistribution layer 108. As will be apparent to persons skilled in the art, in some examples, the first group of contacts 110, depicted in the current cross section will include multiple contacts arranged in a selected pattern (arrayed) extending in X-Y directions across some portion of the contact surface of semiconductor die 102. In many examples, the pattern will be, or include, a rectangular array of contacts which are all arranged at the first pitch relative to one another. Thus the depicted first group of contacts 110 depicted in a row in the plane of the cross-section (for example in the X direction along semiconductor die 102), can include, in many examples, an additional row of contacts beyond the plane of the page, and an additional row of contacts above the plane of the page (thereby arranged in the Y direction (extending perpendicular to the plane of the cross-section), along semiconductor die 102, all arranged at the first pitch relative to other contacts of the first group.

First semiconductor die 102 also includes a second group of contacts, indicated generally at 118, configured to engage second semiconductor die 104. As can be seen from the figure, contacts of the second group of contacts 118 are located at a second pitch 120. Second pitch 120 is less than first pitch 116 (and thus a "finer" pitch than first pitch 116). In some examples, second pitch 120 will be no more than approximately 70% of the dimension of first pitch 116; while in other examples, second pitch 120 will be no more than approximately 50% of the dimension of first pitch 116. Such comparative dimensions are not necessarily required, however, as benefits may be obtained even if the second pitch is greater, even substantially greater, than approximately 70% of the dimension of first pitch 116.

In some examples, as depicted, contacts of the second group 118 will include metallic pillars extending from first semiconductor die 102 at least partially through redistribution layer 108. In some examples, the pillars forming the contacts of the second group 118 may have a dimension to extend sufficiently to directly engage contact surfaces essentially at the surface of second semiconductor die 104. In other configurations, however, such as that depicted in FIG. 1A, second semiconductor die 104 will include a third group of contacts, indicated generally at 122, and the contacts of this third group 122 will each have metallic pillars extending from the surface of second semiconductor die 104. The metallic pillars of the second and third groups of contacts can be, for example copper (Cu) pillars. In such examples, such copper pillars of the second and third groups of contacts will be bonded to one another through a tin-silver (Sn—Ag) interface applied to the surface of the contacts of either (or both) of the second and third groups of contacts, 118 and 122 respectively.

As with the first group of contacts 110, the second and third groups of contacts 118 depicted in a row in the plane of the cross section will also include multiple contacts arranged in a selected pattern (arrayed) extending in X-Y directions across some portion of the contact surface of semiconductor die 102. Again, in some examples, the pattern will be, or include, a rectangular array of contacts which are all arranged at the second pitch relative to one another. Thus, each of the depicted second group of contacts 118, and the third group of contacts 122 depicted in respective rows in the plane of the cross-section, can include, in many examples, one or more additional rows of contacts beyond the plane of the page, and one or more additional rows of contacts above the plane of the page, all arranged at the second pitch relative to other contacts of the respective group. In some examples, the contacts of the second and/or third groups 118, 122, in addition to being arrayed at the second, smaller, pitch, may also each have a smaller lateral dimension (width), than the contacts of the first group 110.

While the current description focuses upon the contacts of the first, second, and third groups, semiconductor die may include additional contacts (individual or an array) that are not a part of the first and second groups. The discussion below identifies that second semiconductor die 104 can include one or more additional contacts, as indicated at 124, which is not a part of the third group of contacts. In the same manner, first semiconductor die 102 may also include one or more contacts (including an array of contacts) that are not a part of the contacts of either the first group 110 or the second group 118. Any additional contacts on either of semiconductor die 102 or 104, can be distinguished from being part of any of contact groups 110, 118, or 122 (as appropriate), by being spaced from the contacts of any of those groups, by a distance which is greater than the pitch of such contact group.

Package 100 includes a mechanism for coupling contacts of the first group of contacts 110 to a first side of the redistribution layer 108. In some embodiments, such as that depicted in FIG. 1A, this mechanism will include the first group of contacts having planar metal contact pads formed of, for example, aluminum or copper. As described in more detail relative to FIGS. 2A-H, this mechanism will also include metallic traces formed in redistribution layer 108 which extend to electrically contact respective contacts of first group of contacts 110. In other embodiments, the mechanism for coupling contacts of the first group of contacts to a first side of the redistribution layer may include contacts of the first group of contacts 110 being formed with metallic pillars or similar extending structures, such as copper pillars, extending to the surface of, or beyond, any passivation layer over the first semiconductor die. The redistribution layer 108 may then be formed over such pillars of the first group of contacts 110.

Package 100 also includes a mechanism for coupling contacts of the second group of contacts 118 to contacts of the third group of contacts 122 on second semiconductor die 104. Because of the finer pitch of contacts of the second group of contacts 118, an interconnect structure suitable for such finer pitch can be used in place of other structures such as may be used for the first group of contacts 110. Because the second and third groups of contacts, 118, 122, respectively do not need to electrically engage the redistribution layer 108, the configuration of these contacts is open to structural options which facilitate direct connection with one another. In some examples, the mechanism for coupling contacts of the second and third groups of contacts can include either the second or third group of contacts formed as planar surfaces which will engage with pillars or other extensions of the other group of contacts. In other examples, such as the examples of FIG. 1A, the mechanism may include both the second and third group of contacts including pillars placed at the same (second) pitch and which may be bonded directly to one another. In some examples (of either configuration), the coupling mechanism will include a bonding interface material to facilitate the described bonding. For example, where the extending pillars are copper (Cu), an interface of tin-silver (SnAg) may beneficially be used to facilitate bonding between the contacts.

Package 100 also illustrates the use of an additional one or more contacts 124 (in the example depicted as a single contact) outside the third group of contacts 122. When the second semiconductor die 104 is in only partially overlapping relation with the first semiconductor die 102 (as depicted in the present example), second semiconductor die 104 may include additional contact(s) 124 which extend to engage respective contacts 126 formed in redistribution layer 108. Where the additional one or more contacts includes multiple contacts, those contacts may be at a greater pitch than the second pitch 120 of the second and third groups of contacts. This greater pitch is to once again accommodate any restrictions on spacing imposed by the requirements of the redistribution layer 108. In some examples, and as depicted relative to package 100, the one or more additional contact(s) 124 will contact redistribution layer 108 at a contact, as indicated at 126, located laterally beyond the periphery, or footprint, of first semiconductor die 102. As discussed above, additional contact(s) 124 may be identified as not part of the third group of contacts because it is spaced from the depicted third group of contacts 122 by a distance which is greater than the second pitch at which such third group of contacts 122 are spaced.

In some examples, the additional contact(s) 124 will provide electrical connection between second semiconductor die 104 and electrical traces within redistribution layer 108. In other examples, however, additional contacts) 124 may just connect to an electrically isolated contact to provide a further mechanical connection between second semiconductor die 104 and the additional structure of package 100. Thus, the "contact" structures described herein include, but are not limited to, interconnections for communicating electrical signals from one device or location to another, and expressly include interconnections for establishing only mechanical connections.

In some example microelectronic packages, even where the redistribution layer is in a "fan-out" configuration, the second semiconductor die may extend entirely within the periphery of the first semiconductor die, or all electrical connections of the second semiconductor die may couple to the second group of contacts on the first semiconductor die. However, as is apparent from FIG. 1A, another likely configuration is that the second semiconductor die 104 is in only partially overlapping relation to first semiconductor die 102, and therefore may be in contact with redistribution layer 108 through one or more additional contacts 124, as described above.

One benefit of the described structure is reducing the dimensional requirements of a semiconductor die by facilitating direct connections between multiple die using contacts spaced at a finer pitch than contacts spaced to engage the redistribution layer. Additionally, the described structure provides interconnections between die having a minimal length, thereby minimizing potentially negative effects of longer interconnects.

Figure 1B:
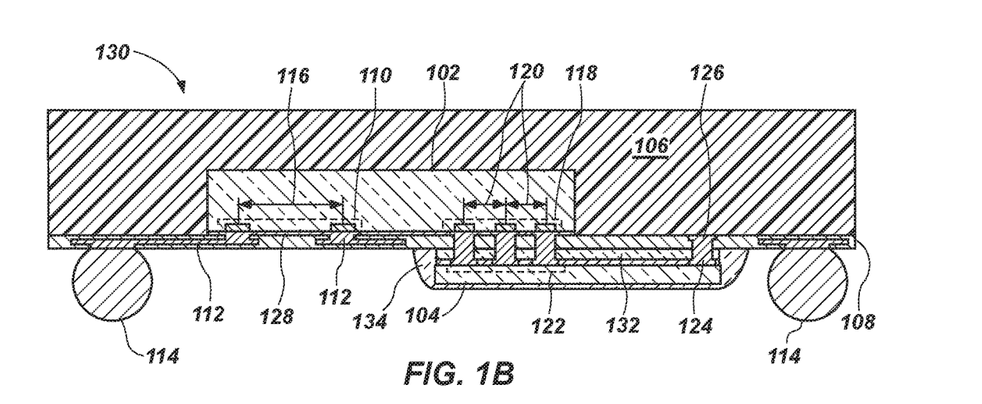

Referring now to FIG. 1B, the figure depicts a modified package 130, including the structure of package 100 with additional structures formed therein. As a result, the reference numerals used in reference to package 100 are repeated here in reference to package 130. A first additional structure is found in underfill material 132 placed between second semiconductor die 104 and redistribution layer 108. Underfill material 132 can be of various types known to persons skilled in the art, and can be placed by various mechanisms known to such persons skilled in the art. For example, underfill material 132 may be an epoxy resin, in many cases containing silicon oxide ($SiO_2$), and can be placed, for example, by a capillary underfill process.

Package 130 also includes an encapsulant, indicated generally at 134, extending to cover the exterior surfaces of second semiconductor die 104, and preferably extending to the lower surface of redistribution layer 108 (as depicted). The encapsulant 134 will preferably extend at least in the vicinity of second semiconductor die 104. In other examples, encapsulant may be extended to cover a larger portion, or the entirety, of the depicted lower surface of redistribution layer 108 (with the exception of not covering contact balls 114).

Either underfill material 132 or encapsulant 134 may enhance mechanical connection of second semiconductor die 104 within package 130. Underfill material 132 and encapsulant 134 can be used independently of one another. As a result, only one of underfill material 132 and encapsulant 134 may be present; or both, or neither, may be utilized.

Figure 2A:
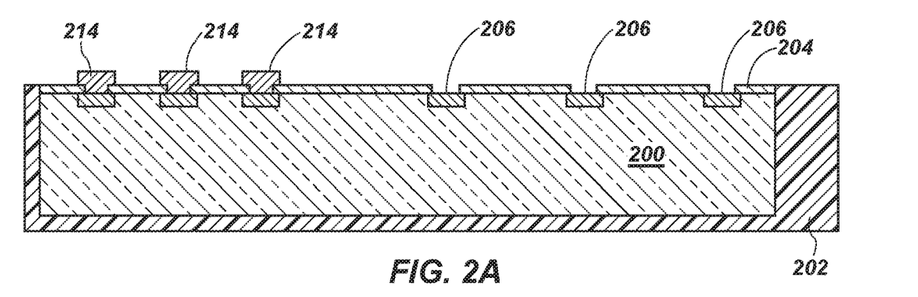
FIGS. 2A-H depict sequential stages of an example process flow for forming an IC package such as that of FIG. 1A.

Referring now to FIGS. 2A-H, these figures depict sequential stages of an example process flow for forming an IC package such as that of FIG. 1A. FIG. 2A begins with a semiconductor die 200 place within a molded component 202 (only a portion of which is depicted), representing "reconstitution" of a wafer. As an example of such "reconstitution" of a wafer, as known to persons skilled in the art, individual singulated die are placed on a mold carrier in spaced relation to one another, the spacing selected to provide an intended dimension for accommodating a redistribution layer of a selected dimension to be formed relative to each die, and to accommodate subsequent singulation of the redistribution layers and supporting molded structure (with attached die).

In an example flow, a separation layer such as a foil layer will be laminated onto a mold carrier. Individual die will be placed on the foil layer at the desired spacing, such as through use of a pick and place tool. A molding compound will then be placed in the mold carrier and molded under appropriate conditions to surround each die to the required dimension. Once the molding is complete, the reconstituted wafer will be de-bonded from the foil and the remainder of the mold carrier for further processing.

FIG. 2A shows the beginning of the process flow after such reconstitution of the wafer. As depicted, semiconductor die 200 includes a passivation layer 204 opened to provide access to metal contact pads 206. Metal contact pads 206, such as aluminum contact pads, form a first group of contacts 208 which are arranged at a first relative pitch to one another, as indicated generally at 210. Semiconductor die 200 also includes a second group of contacts 212, which each include a respective metallic pillar, such as a copper pillar 214. In this second group of contacts 212, metallic pillars are arranged at a second pitch 218 which is a finer pitch than pitch 210 of the first group of contacts 208. In some example processes, passivation layer 204 and copper pillars 214 are formed during processing of the semiconductor die. In other processes, the passivation layer 204 may be formed, or if previously formed may be opened, after reconstitution of the wafer as depicted in FIG. 2A. Similarly, in some process flows copper pillars 214 may be formed after reconstitution of the wafer.

Figure 2B:
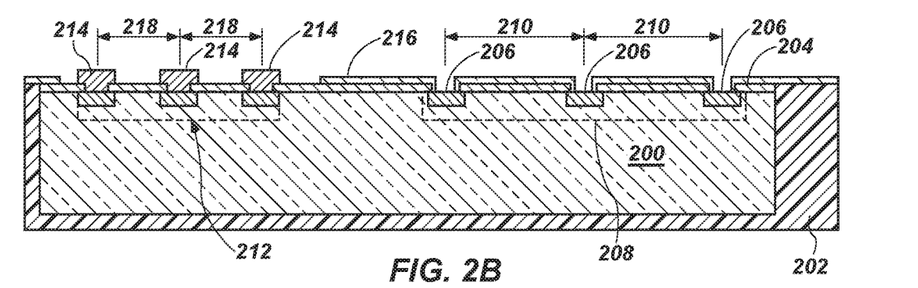

Referring now to FIG. 2B, a first dielectric layer 216 which will form a portion of a redistribution layer will be formed over a portion of semiconductor die 200 and molded component 202. In some examples, the first dielectric layer 216 will include a polyamide layer, and will be formed by deposition across the surface of the reconstituted wafer and subsequent photolithographic patterning. In the depicted example, dielectric layer 216 will be removed in the vicinity of the second group of contacts 212. However such removal is not required, and in some processes dielectric layer 216 may be left in place surrounding (but not extending over) copper pillars 214.

Figure 2C:
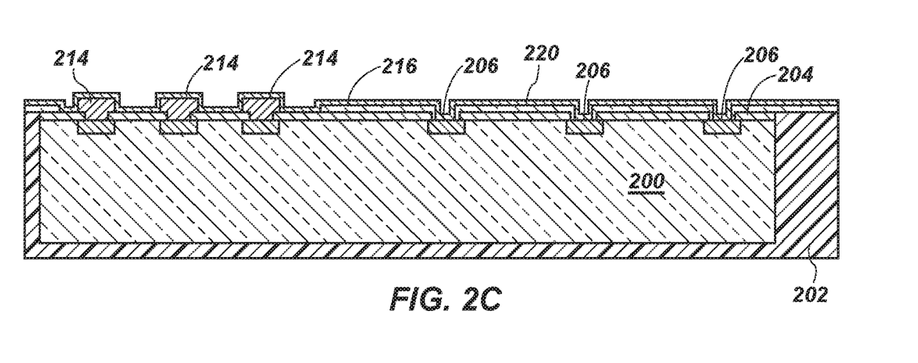

Referring now to FIG. 2C, a seed layer 220 for electrochemical plating of traces in the redistribution layer will be deposited. In examples where the traces in the redistribution layer will be copper, the seed layer may be a sputtered metallic layer, such as, for example, titanium-tungsten/copper (TiW/Cu) or titanium/copper (Ti/Cu).

In some examples, such as that depicted in FIG. 2C, the seed layer will be sputtered on the surface of the reconstituted wafer. In other examples, the region proximate the second group of contacts 212 can be masked before forming of the seed layer.

Figure 2D:
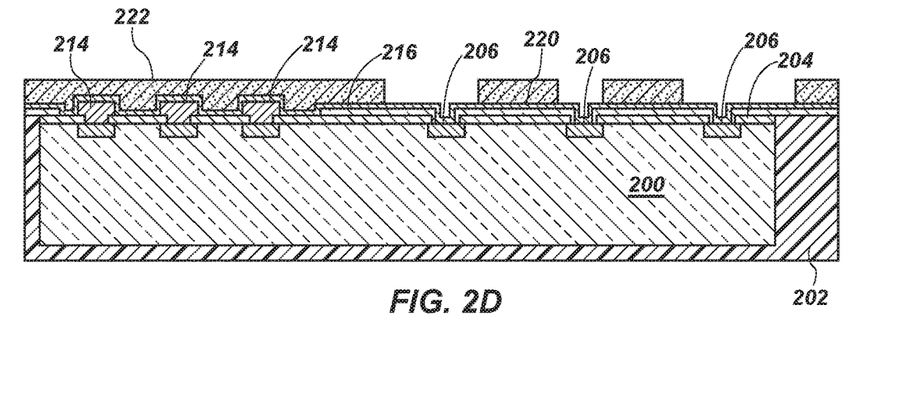

Referring now to FIG. 2D, in the depicted example a plating resist 222 is deposited over the seed layer, and then patterned in a conventional manner to define the contours for forming conductive traces of the redistribution layer.

Figure 2E:
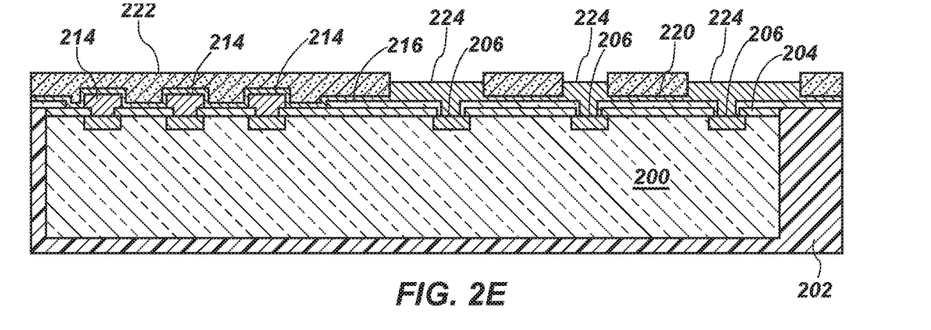

Referring now to FIG. 2E, a metal layer 224, for example copper, will then be deposited over the portions of seed layer 220 left exposed by patterned plating resist 222. An example method for depositing the additional copper (or other metal) will be electroplating.

Figure 2F:
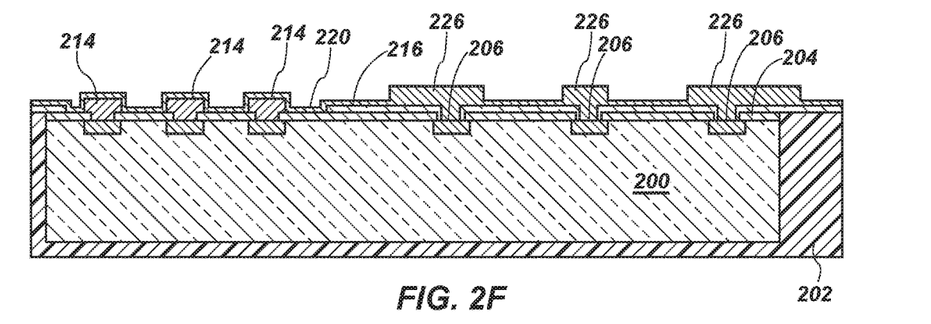
Figure 2G:
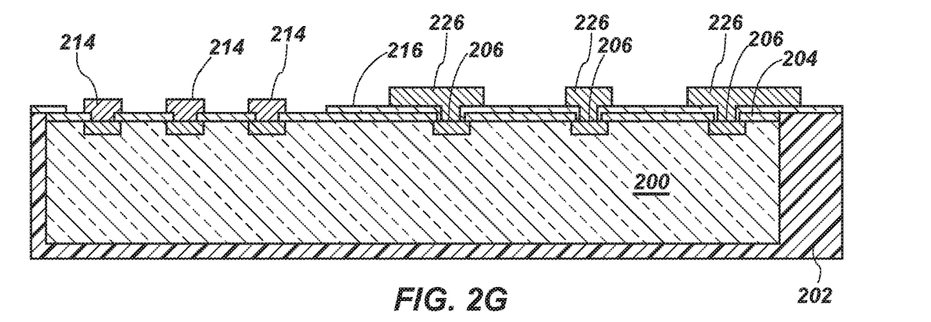

Referring now to FIG. 2F, once metal layer 224 is formed, then patterned plating resist 222 may be removed. Referring to FIG. 2G, the now exposed portion of the seed layer 220 may then be etched. In examples such as that described, wherein the seed layer is either titanium-tungsten/copper (TiW/Cu) or titanium/copper (Ti/Cu), an example suitable chemistry for removing the sputtered copper is nitric acid ($HNO_3$), and an example suitable chemistry for removing the titanium (Ti) or titanium-tungsten (TiW) is hydrogen peroxide ($H_2O_2$) plus ammonium hydroxide ($NH_4OH$). Removal of the exposed portion of the seed layer 220 isolates the deposited metal (Cu) traces 226 for the redistribution layer, and also isolates the copper pillars 214 from one another.

Figure 2H:
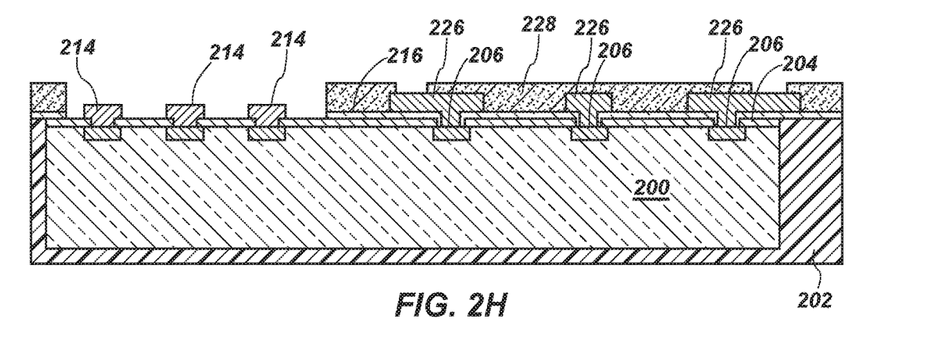

Referring now to FIG. 2H, a second dielectric layer 228 is then formed over the reconstituted wafer surface and patterned (opened) to expose the second group of contacts 212, and also to allow access to contact portions of metal traces 226 of the redistribution layer through openings 230. As discussed relative to package 100 of FIG. 1A, the conductive traces (226) will extend over the molded component 202 to facilitate the placement of contact balls (214 in FIG. 1A) beyond the periphery (i.e., footprint) of semiconductor die 200, where the redistribution layer is supported by molded component 202.

Figure 3:
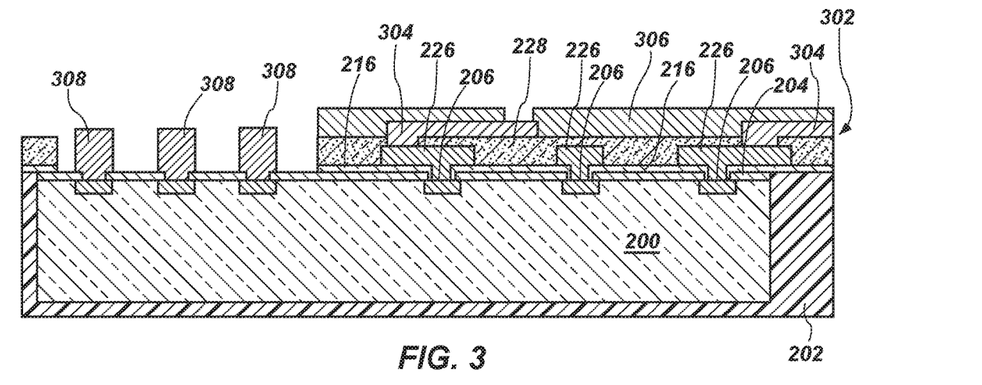
FIG. 3 depicts a stage of processing of a semiconductor die to yield another example embodiment suitable for use in an IC package, such as that of FIG. 1A.

Referring now to FIG. 3, the figure depicts an alternative configuration for microelectronic package 300, which differs from the packages of FIGS. 1A-B and FIGS. 2A-H in having a multi-level redistribution layer, indicated generally at 302. Structures of FIG. 3 directly parallel those depicted in FIG. 2H, and thus have been numbered identically in FIG. 3. The basic structure of package 300 is similar to that depicted in FIG. 2H, but an additional level of conductive traces 304 is disposed above second dielectric layer 228. The additional level of conductive traces 304 is then covered by a third dielectric layer 306. Conductive traces 304 extend to metal traces 226 to further facilitate routing of signals from semiconductor die 200 to desired locations, in the manner depicted in FIG. 1A. In order to facilitate attachment of a second semiconductor die to copper pillars 214, in the manner described in reference to FIG. 1A, it may be desirable to form copper pillars 308 of increased height relative to that of copper pillars 214 in the single level redistribution layer of FIGS. 2A-H. Additionally, in some embodiments it may be desirable to form first dielectric layer 216 to extend around copper pillars 308 (not specifically depicted).

Figure 4:
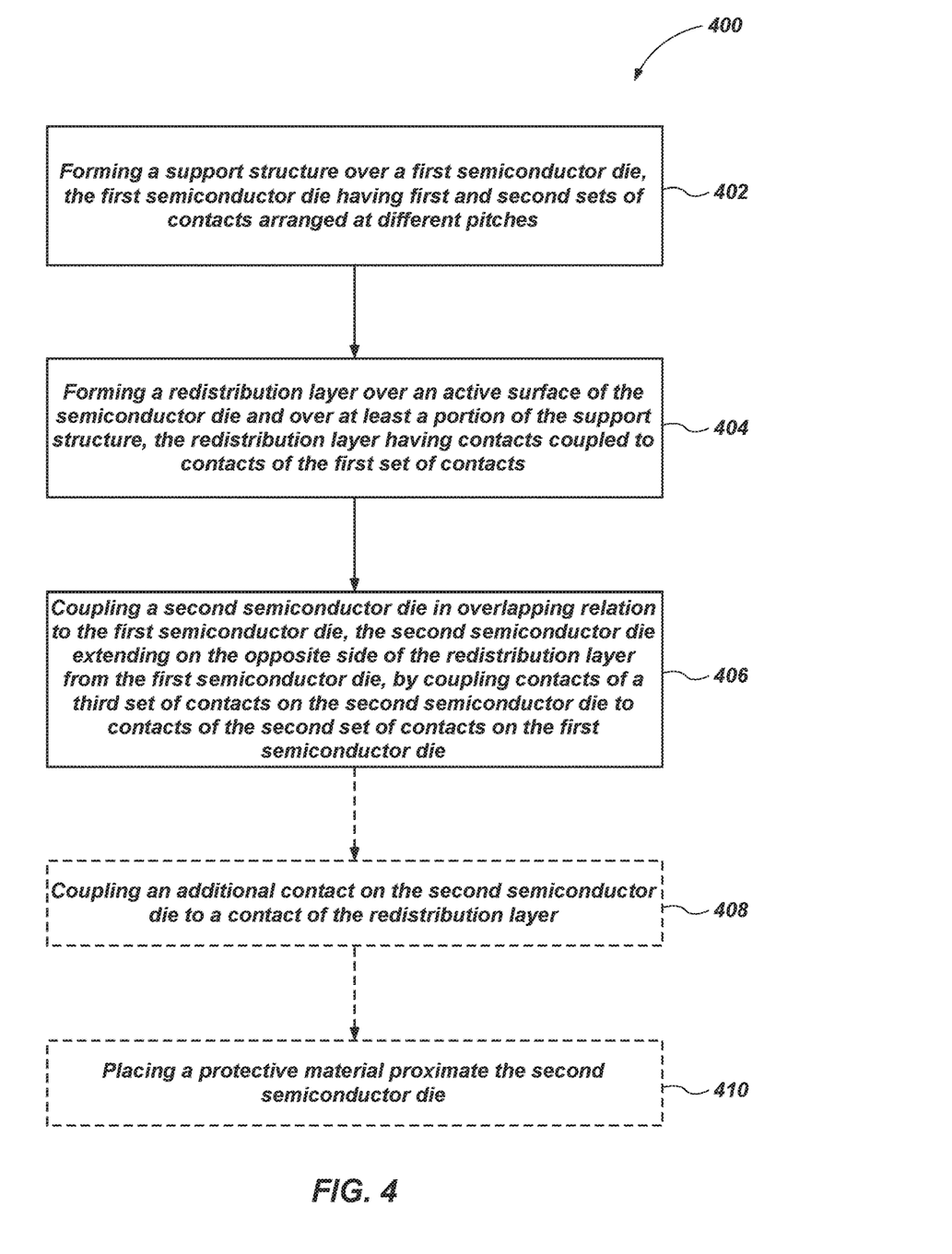
FIG. 4 depicts a flowchart of an example process flow for forming an IC package such as that of FIG. 1A.

Referring now to FIG. 4, the figure depicts a flowchart identifying operations of an example method 400 for forming a microelectronic device package of the type described herein. Referring first to operation 402, a support structure will be formed over a first semiconductor die which includes first and second groups of contacts which are arranged at different pitches from one another, and wherein contacts of the second group are arranged at a finer pitch than contacts of the first group. In many examples, the support structure will be a molded structure.

At operation 404, a redistribution layer is formed over the active surface of the first semiconductor die and over at least a portion of the molded structure. As described elsewhere herein, the redistribution layer includes conductive traces which extend from contacts of the first group of contacts of the first semiconductor die to desired locations for placing contact balls for making electrical connections to other structures. In some examples, at least some of the desired locations for contact balls will be beyond the lateral dimensions of the first semiconductor die, and thus will be in a region where the redistribution layer is supported by the molded structure formed over the first semiconductor die.

At operation 406, a second semiconductor die extends on the opposite side of the redistribution layer from the first semiconductor die, and is placed in at least partially overlapping relation to the first semiconductor die. The second semiconductor die is coupled to the first semiconductor die through a third set of contacts which are placed at the same pitch as the contacts of the second group of contacts on the first semiconductor die, and respective contacts of the second and third groups of contacts are bonded to one another. In various examples, the redistribution layer may have a single level of conductive traces while in other examples the redistribution layer may have two or more levels of conductive traces.

In optional operation 408, the second semiconductor die can include one or more additional contacts (as identified at 124 in FIG. 1A), separate from the third set of contacts, and the method can further include bonding the additional contact(s) to respective contacts on the redistribution layer. In some examples of this method, one or more of the additional contact(s) may be bonded to a contact on the redistribution layer that is beyond the lateral dimensions of the first semiconductor die. As noted elsewhere herein, one or more additional contact(s) may be coupled to redistribution layer contacts that are either coupled to an electrical trace, or that are electrically isolated.

In optional operation 410, a coupling material will be applied to engage both the second semiconductor die and the redistribution layer. In some examples, the coupling material will be an underfill material placed between the second semiconductor die and the redistribution layer; while in other examples the coupling material will be in the form of an encapsulant extending around the second semiconductor die. In some examples the coupling material will include both an underfill material and an encapsulant material.

As noted earlier, many types of semiconductor die may be beneficially packaged together in a microelectronic device in the manner described herein. One example of such a beneficial combination would be a processor die in combination with another device die, such as a memory device, chipset, graphics processor, etc. The resulting microelectronic device package may then be included in a larger electronic device or system.

Figure 5:
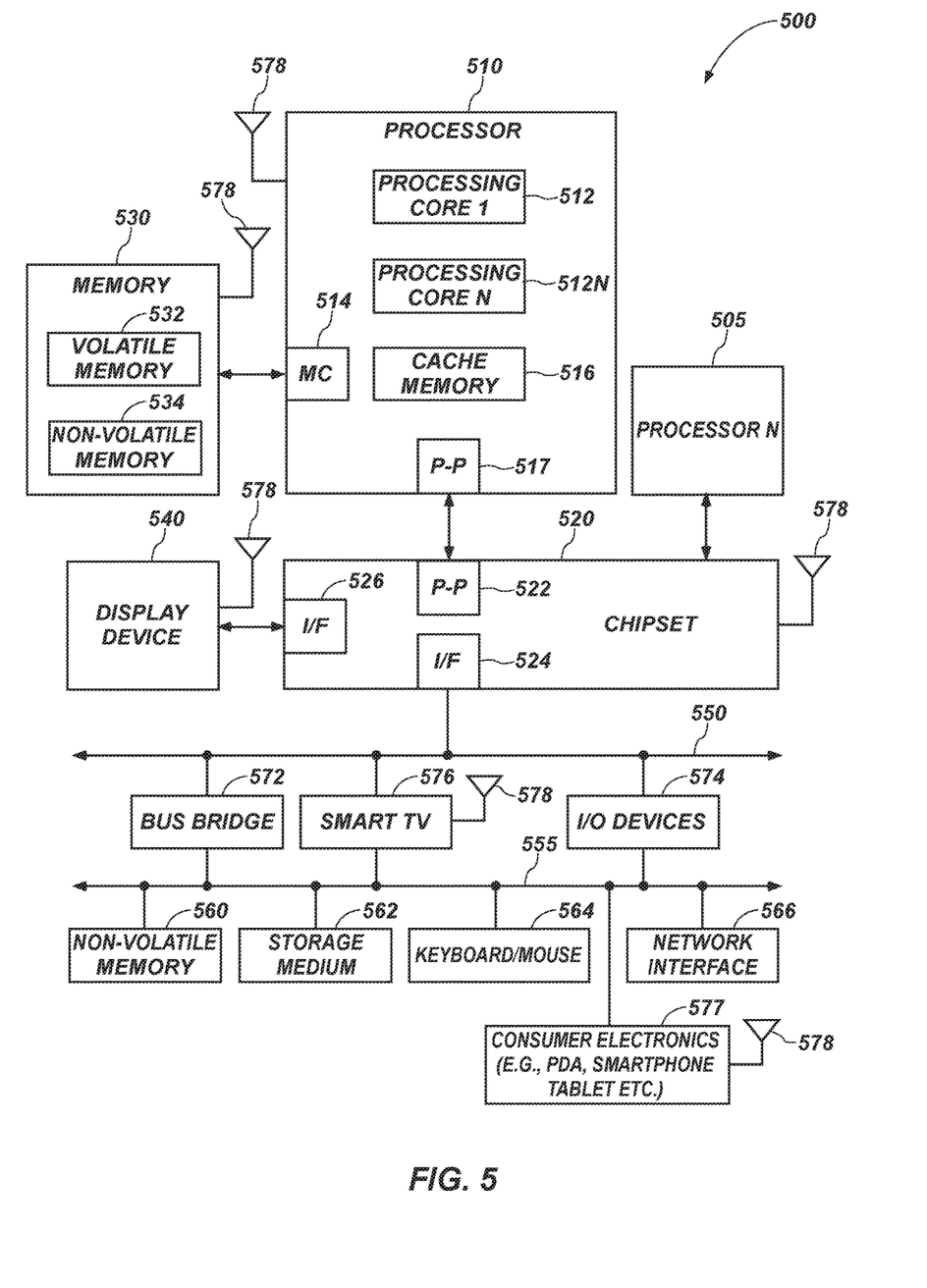
FIG. 5 depicts a system level diagram which may incorporate a microelectronic device such as the IC package of FIG. 1A.

FIG. 5 illustrates a system level diagram, according to one embodiment of the invention. For instance FIG. 5 depicts an example of an electronic device (e.g., system) including the microelectronic device packaged as described in the present disclosure. FIG. 5 is included to show an example of a higher level device application for the present invention. In one embodiment, system 500 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 500 is a system on a chip (SOC) system.

In one embodiment, processor 510 has one or more processing cores 512 and 512N, where 512N represents the Nth processor core inside processor 510 where N is a positive integer. In one embodiment, system 500 includes multiple processors including 510 and 505, where processor 505 has logic similar or identical to the logic of processor 510. In some embodiments, processing core 512 includes, but is not limited to, pre-fetch logic to fetch instructions, decode logic to decode the instructions, execution logic to execute instructions and the like. In some embodiments, processor 510 has a cache memory 516 to cache instructions and/or data for system 500. Cache memory 516 may be organized into a hierarchal structure including one or more levels of cache memory.

In some embodiments, processor 510 includes a memory controller 514, which is operable to perform functions that enable the processor 510 to access and communicate with memory 530 that includes a volatile memory 532 and/or a non-volatile memory 534. In some embodiments, processor 510 is coupled with memory 530 and chipset 520. Processor 510 may also be coupled to a wireless antenna 578 to communicate with any device configured to transmit and/or receive wireless signals. In one embodiment, the wireless antenna interface 578 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 532 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 534 includes, but is not limited to, flash memory, phase change memory (PCM), read-only memory (ROM), electrically erasable programmable read-only memory (EEPROM), or any other type of non-volatile memory device.

Memory 530 stores information and instructions to be executed by processor 510. In one embodiment, memory 530 may also store temporary variables or other intermediate information while processor 510 is executing instructions. In the illustrated embodiment, chipset 520 connects with processor 510 via Point-to-Point (PtP or P-P) interfaces 517 and 522. Chipset 520 enables processor 510 to connect to other elements in system 500. In some embodiments of the invention, interfaces 517 and 522 operate in accordance with a PtP communication protocol such as the Intel® QuickPath Interconnect (QPI) or the like. In other embodiments, a different interconnect may be used.

In some embodiments, chipset 520 is operable to communicate with processor 510, 505N, display device 540, and other devices 572, 576, 574, 560, 562, 564, 566, 577, etc. Chipset 520 may also be coupled to a wireless antenna 578 to communicate with any device configured to transmit and/or receive wireless signals.

Chipset 520 connects to display device 540 via interface 526. Display 540 may be, for example, a liquid crystal display (LCD), a plasma display, cathode ray tube (CRT) display, or any other form of visual display device. In some embodiments of the invention, processor 510 and chipset 520 are merged into a single SOC. In addition, chipset 520 connects to one or more buses 550 and 555 that interconnect various elements 574, 560, 562, 564, and 566. Buses 550 and 555 may be interconnected together via a bus bridge 572. In one embodiment, chipset 520 couples with a non-volatile memory 560, a mass storage device(s) 562, a keyboard/mouse 564, and a network interface 566 via interface 524 and/or 504, smart TV 576, consumer electronics 577, etc.

In one embodiment, mass storage device 562 includes, but is not limited to, a solid state drive, a hard disk drive, a universal serial bus flash memory drive, or any other form of computer data storage medium. In one embodiment, network interface 566 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 5 are depicted as separate blocks within the system 500, the functions performed by some of these blocks may be integrated within a single semiconductor circuit or may be implemented using two or more separate integrated circuits. For example, although cache memory 516 is depicted as a separate block within processor 510, cache memory 516 (or selected aspects of 516) can be incorporated into processor core 512.

To better illustrate the methods and apparatuses described herein, a non-limiting set of example embodiments are set forth below as numerically identified examples:

Example 1 is a microelectronic device, including: a first semiconductor die having a first group of contacts at a first pitch relative to one another, and a second group of contacts at a second pitch relative to one another, the second pitch being less than the first pitch; a redistribution layer having a first side coupled to the first semiconductor die; and a second semiconductor die on the opposite side of the redistribution layer from the first semiconductor die, the second semiconductor device having a third group of contacts at the second pitch, the contacts of the third group of contacts coupled to respective contacts of the second group of contacts.

In Example 2, the subject matter of Example 1 optionally includes that the second semiconductor device further includes at least one additional contact outside the third group of contacts.

In Example 3, the subject matter of Example 2 optionally including the additional contact coupled to a contact of the redistribution layer that is outside a footprint of the first semiconductor die.

In Example 4, the subject matter of any one or more of Examples 2-3 optionally including at least one of the first and second groups of contacts having an array of contacts extending along both X and Y dimensions of the first semiconductor die.

In Example 5, the subject matter of any one or more of Examples 1-4 optionally including the redistribution layer coupling at least some contacts of the first group of contacts to respective locations outside a footprint of the first semiconductor die.

In Example 6, the subject matter of any one or more of Examples 1-5 optionally including a molded structure supporting the redistribution layer and encapsulating the first semiconductor die.

In Example 7, the subject matter of any one or more of Examples 1-6 optionally including the redistribution layer having multiple levels of conductive traces.

Example 8 is a package for a microelectronic device, including: a first semiconductor die having a first group of contacts at a first pitch relative to one another in both X and Y directions, and a second group of contacts at a second pitch relative to one another in both X and Y directions, the second pitch being less than the first pitch; a molded structure extending over the first semiconductor die; a redistribution layer having a first side coupled to the first semiconductor die and supported at least in part by the molded structure; and a second semiconductor die extending on the opposite side of the redistribution layer from the first semiconductor die, the second semiconductor die having a third group of contacts, the contacts of the third group of contacts are arranged at the second pitch in both X and Y directions, and are coupled to respective contacts of the second group of contacts.

In Example 9, the subject matter of Example 8 optionally includes the redistribution layer including contact balls, and where at least a portion of the contacts of the first group of contacts are connected through the redistribution layer to respective contact balls laterally beyond the lateral dimensions of the first semiconductor die.

In Example 10, the subject matter of any of Examples 8-9 optionally includes the redistribution layer including contact balls, and where at least a portion of the contacts of the first group of contacts are connected through the redistribution layer to respective contact balls laterally beyond the lateral dimensions of the first semiconductor die, and the contact balls are located on the same side of the redistribution layer as the second semiconductor die.

In Example 11, the subject matter of any one or more of Examples 8-10 optionally include the second semiconductor die including at least one additional contact outside the third group of contacts, and where the at least one additional contact is coupled to a contact in the redistribution layer.

In Example 12, the subject matter of Example 11 optionally includes where one additional contact is coupled to provide only a mechanical connection to the redistribution layer.

In Example 13, the subject matter of any one or more of Examples 8-12 optionally including the redistribution layer having multiple levels of conductors.

In Example 14, the subject matter of any one or more of Examples 8-13 optionally including the contacts of the second group of contacts coupled to respective contacts of the third group of contacts through copper pillars formed on each of the first and second semiconductor die.

In Example 15, the subject matter of any one or more of Examples 8-14 optionally including the pitch of the second group of contacts being no more than approximately 70% of the pitch of the first group of contacts.

In Example 16, the subject matter of any one or more of Examples 8-15 optionally including the pitch of the second group of contacts being no more than approximately 50% of the pitch of the first group of contacts.

Example 17 is a microelectronic device, including: a first semiconductor die having a first group of contacts at a first pitch relative to one another, and a second group of contacts at a second pitch relative to one another, the second pitch being less than the first pitch; means for coupling the first group of contacts of the first semiconductor die to a first side of a redistribution layer; and means for coupling a second semiconductor die to the second group of contacts of the first semiconductor die, the second semiconductor die located on the opposite side of the redistribution layer from the first semiconductor die.

In Example 18, the subject matter of Example 17 optionally including the means for coupling the second semiconductor die to the second group of contacts including, a third group of contacts on the second semiconductor die, the third group of contacts arranged at the second pitch relative to one another; and where the contacts of at least one of the second and third groups of contacts include metallic pillars establishing electrical communication with the other set of contacts.

In Example 19, the subject matter of Example 18 optionally including the contacts of both the second and third groups of contacts including copper pillars.

In Example 20, the subject matter of any one or more of Examples 17-19 optionally including the redistribution layer having contact balls to engage a supporting structure, at least some of the contact balls electrically coupled to respective contacts of the first group of contacts.

In Example 21, the subject matter of any one or more of Examples 19-20 optionally including the metallic pillars extending through a separation in the redistribution layer to engage the other set of contacts.

Example 22 is a method for forming a microelectronic device package, including: forming a molded structure over a first semiconductor die, where the die includes first and second groups of contacts, where the contacts of each of the first and second groups are respectively arranged at first and second pitches, and where the contacts of the second group are at a finer pitch than the contacts of the first group; forming a redistribution layer over the first semiconductor die and at least a portion of the molded structure; and coupling a second semiconductor die to the first semiconductor die, the second semiconductor die on the opposite side of the redistribution layer from the first semiconductor die, where the second semiconductor die includes a third group of contacts arranged at the same pitch as the contacts the second group, and where the second semiconductor die is coupled to the first semiconductor die at least in part by bonding contacts of the third group to respective contacts of the second group.

In Example 23, the subject matter of Example 22 optionally includes the bonding contacts of the third group to respective contacts of the second group including bonding together copper pillars formed on both the contacts of the second group and the contacts of the third group.

In Example 24, the subject matter of any one or more of Examples 22-23 optionally including the second semiconductor die including at least one additional contact outside the third group of contacts, and where the additional contact is bonded to a contact on the redistribution layer.

In Example 25, the subject matter of any one or more of Examples 22-24 optionally including placing an underfill material between the second semiconductor die and the redistribution layer.

In Example 26, the subject matter of any one or more of Examples 22-25 optionally including forming an encapsulant material over the second semiconductor die.

In Example 27, the subject matter of any one or more of Examples 22-26 optionally including at least one of the first and second groups of contacts includes an array of contacts extending in both X and Y directions on the first semiconductor die.

In Example 28, the subject matter of any one or more of Examples 22-27 optionally including forming contact balls on contacts of the redistribution layer.

In Example 29, the subject matter of Example 28 optionally including contacts of the first group of contacts being coupled to respective contact balls through conductive paths formed in the redistribution layer.

In Example 30, the subject matter of any one or more of Examples 22-29 optionally including the pitch of the second group of contacts being no more than approximately 70% of the pitch of the first group of contacts.

In Example 31, the subject matter of any one or more of Examples 22-30 optionally including the pitch of the second group of contacts being no more than approximately 50% of the pitch of the first group of contacts.

In Example 32, the subject matter of any one or more of Examples 22-31 optionally including that the package is a fan-out package.

In Example 33, the subject matter of any one or more of Examples 23-32 optionally including that the copper pillars from the first and second groups of contacts are bonded together through use of a tin-silver (SnAg) layer.

In Example 34, the subject matter of any one or more of Examples 23-33 optionally including that the copper pillars from the second and third sets of contacts form no electrical connection with the redistribution layer.

Example 35 is an electronic system, including: a microelectronic device, including, a first semiconductor die having a first group of contacts at a first pitch relative to one another, and a second group of contacts at a second pitch relative to one another, the second pitch being less than the first pitch; a redistribution layer having a first side coupled to the first semiconductor die; and a second semiconductor die on the opposite side of the redistribution layer from the first semiconductor die and then partially overlapping relation to the first semiconductor die, the second semiconductor device having a third group of contacts at the second pitch, the contacts of the third group of contacts coupled to respective contacts of the second group of contacts; and at least one of a mass storage device and a network interface operably coupled to the microelectronic device.

In Example 36, the subject matter of Example 35 optionally including that the second semiconductor device further includes at least one additional contact outside the third group of contacts.

In Example 37, the subject matter of any of Examples 34-36 optionally including that the second semiconductor device further includes at least one additional contact outside the third group of contacts, and the additional contact is coupled to a contact in the redistribution layer.

In Example 38, the subject matter of Example 37 optionally including that the second semiconductor device further includes at least one additional contact outside the third group of contacts, and the additional contact is outside a footprint of the first semiconductor die.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A microelectronic device, comprising:
   a first semiconductor die having a first group of contacts at a first pitch relative to one another, and a second group of contacts at a second pitch relative to one another, the second pitch being less than the first pitch, wherein at least one of the first and second groups of contacts includes an array of contacts extending along both X and Y dimensions of the first semiconductor die;

a molded component extending over the first semiconductor die;

a redistribution layer having a first side coupled to the first semiconductor die, the redistribution layer having first redistribution layer contacts engaging contacts of the first group of contacts, wherein the redistribution layer includes a dielectric layer formed on both the first semiconductor die and the molded component, and further includes conductive structures supported by the dielectric layer;

a second semiconductor die on the opposite side of the redistribution layer from the first semiconductor die, the second semiconductor device having a third group of contacts at the second pitch, the contacts of the third group of contacts coupled directly to respective contacts of the second group of contacts by direct attachments of respective second and third contacts, of which contacts of at least one of the second and third groups of contacts are in the form of metallic pillars that extend through the redistribution layer to engage the contacts of the other group, and without making electrical connection with the redistribution layer; and wherein the second semiconductor die is secured on the opposite side of the redistribution layer from the first semiconductor die, and placed within a vertical dimension established by contact balls on that same opposite side of the redistribution layer from the first semiconductor die, and wherein the contact balls are configured for attaching the microelectronic device to an additional structure.

2. The microelectronic device of claim 1, wherein the second semiconductor device further comprises at least one additional contact outside the third group of contacts.

3. The microelectronic device of claim 2, wherein the additional contact is coupled to a contact of the redistribution layer that is outside a footprint of the first semiconductor die.

4. The microelectronic device of claim 1, wherein the redistribution layer further comprises conductive structures coupling at least some contacts of the first group of contacts to respective contact locations outside a footprint of the first semiconductor die.

5. The microelectronic device of claim 1, wherein the redistribution layer comprises multiple levels of conductive traces.

6. A package for a microelectronic device, comprising:
a first semiconductor die having a first group of contacts at a first pitch relative to one another in both X and Y directions, and a second group of contacts at a second pitch relative to one another in both X and Y directions, the second pitch being less than the first pitch;
a molded structure extending over the first semiconductor die;
a redistribution layer having a first side coupled to the first semiconductor die wherein the redistribution layer includes a dielectric layer formed at least in part on both the molded structure and the first semiconductor die, the redistribution layer further comprising conductive structures supported by the dielectric layer, and the redistribution layer having first redistribution layer contacts engaging contacts of the first group of contacts of the first semiconductor die; and
a second semiconductor die extending on the opposite side of the redistribution layer from the first semiconductor die, the second semiconductor die having a third group of contacts, the contacts of the third group of contacts are arranged at the second pitch in both X and Y directions, and are coupled to respective contacts of the second group of contacts;
wherein contacts of the second group of contacts include metallic pillars extending through the redistribution layer without making electrical connection to conductors within the redistribution layer and coupling to respective contacts of the third group of contacts;
wherein the package further comprises contact balls formed on the redistribution layer and configured to attach the package to another component; and
wherein the second semiconductor die is in an inverted orientation relative to the first semiconductor die, and is located between first and second of the contact balls, and in the vertical space beneath the redistribution layer to which the contact balls extend.

7. The package of claim 6, wherein at least a portion of the contacts of the first group of contacts are connected through the redistribution layer to respective contact balls laterally beyond the lateral dimensions of the first semiconductor die.

8. The package of claim 6, wherein the second semiconductor die comprises at least one additional contact outside the third group of contacts, and wherein the at least one additional contact is coupled to a contact in the redistribution layer.

9. The package of claim 8, wherein one additional contact is coupled to provide only a mechanical connection to the redistribution layer.

10. The package of claim 6, wherein the pitch of the second group of contacts is no more than approximately 70% of the pitch of the first group of contacts.

11. The package of claim 6, wherein the pitch of the second group of contacts is no more than approximately 50% of the pitch of the first group of contacts.

12. An electronic system, comprising:
a microelectronic device, comprising,
a first semiconductor die having a first group of contacts at a first pitch relative to one another, and a second group of contacts at a second pitch relative to one another, the second pitch being less than the first pitch;
a molded component extending over the first semiconductor die;
a redistribution layer formed on both the first semiconductor die and the molded component, the redistribution layer having a first side coupled to the first semiconductor die, the redistribution layer having first redistribution layer contacts engaging contacts of the first group of contacts, wherein the redistribution layer includes a dielectric layer formed on both the first semiconductor die and a molded component, and further includes conductive structures supported by the dielectric; and
a second semiconductor die on the opposite side of the redistribution layer from the first semiconductor die and in partially overlapping relation to the first semiconductor die, the second semiconductor device having a third group of contacts at the second pitch, the contacts of the third group of contacts coupled directly to respective contacts of the second group of contacts, wherein contacts of the second group of contacts include metallic pillars that extend through the redistribution layer to couple to respective contacts of the third group of contacts and without making electrical connection with the redistribution layer;
wherein the redistribution layer includes a dielectric layer formed on both the first semiconductor die and a molded component, and wherein the molded component extends around the first semiconductor die; and at least one of a mass storage device and a network interface operably coupled to the microelectronic device.

13. The electronic system of claim 12, wherein the additional contact is outside a footprint of the first semiconductor die.

* * * * *